(12) United States Patent
van Mol et al.

(10) Patent No.: US 9,263,700 B2
(45) Date of Patent: Feb. 16, 2016

(54) OPTO-ELECTRIC DEVICE AND METHOD OF MANUFACTURING AN OPTO-ELECTRIC DEVICE

(75) Inventors: Antonius Maria Bernardus van Mol, Eindhoven (NL); Peter van de Weijer, Heeze (NL); Dimiter Lubomirov Kotzev, Basel (NL)

(73) Assignees: Nederlandse Organisatie voor toegepast-natuurwetenschappelijk onderzoek TNO, Delft (NL); Huntsman Advanced Materials (Switzerland) GmbH, Basel (CH); Koninklijke Philips N.V., Eindhoven (NL)

( * ) Notice: Subject to any disclaimer, the term of this patent is extended or adjusted under 35 U.S.C. 154(b) by 396 days.

(21) Appl. No.: 13/881,441

(22) PCT Filed: Sep. 27, 2011

(86) PCT No.: PCT/NL2011/050653
§ 371 (c)(1),
(2), (4) Date: Oct. 16, 2013

(87) PCT Pub. No.: WO2012/057615
PCT Pub. Date: May 3, 2012

(65) Prior Publication Data
US 2014/0049825 A1    Feb. 20, 2014

(30) Foreign Application Priority Data

Oct. 25, 2010    (EP) .................................... 10188765

(51) Int. Cl.
*H01L 51/52* (2006.01)
*H01L 51/54* (2006.01)
*G02B 1/10* (2015.01)

(52) U.S. Cl.
CPC ............ *H01L 51/5256* (2013.01); *G02B 1/105* (2013.01); *H01L 51/5253* (2013.01); *H01L 51/5259* (2013.01); *H01L 2251/5369* (2013.01)

(58) Field of Classification Search
CPC ............ H01L 51/5259; H01L 51/5256; H01L 51/5253; H01L 2251/5369; G02B 1/105; H01J 29/94; H01J 7/183; H01J 7/18; H01J 7/186; H01J 9/38; H01J 9/395; H01J 9/385
USPC ............ 313/498–512; 445/24–25, 29, 31, 53, 445/55
See application file for complete search history.

(56) References Cited

U.S. PATENT DOCUMENTS

| 7,109,651 B2 | 9/2006 | Nakamura |
| 2003/0117066 A1 | 6/2003 | Silvernail |

(Continued)

FOREIGN PATENT DOCUMENTS

| CN | 1650230 A | 8/2005 |
| CN | 1813220 A | 8/2006 |

(Continued)

OTHER PUBLICATIONS

Examination Report dated Apr. 25, 2014 from European Application No. 11 776 605.5-1552.

(Continued)

*Primary Examiner* — Anne Hines
*Assistant Examiner* — Jose M Diaz
(74) *Attorney, Agent, or Firm* — Swanson & Bratschun, L.L.C.

(57) ABSTRACT

An opto-electric device is presented that comprises an opto-electric element enclosed by a barrier structure for inhibiting a transmission of moisture from an environment towards the opto-electric element. The barrier structure includes a stack of layers comprising at least an inorganic layer and a moisture getter material in a layer arranged between the inorganic layer and the opto-electric element. The stack includes a lateral diffusion layer, wherein the getter material is present in a separate getter layer arranged between the opto-electric element and the lateral diffusion layer and/or the getter material is present in the lateral diffusion layer.

21 Claims, 6 Drawing Sheets

(56) References Cited

U.S. PATENT DOCUMENTS

| | | |
|---|---|---|
| 2003/0117068 A1 | 6/2003 | Forrest |
| 2003/0127973 A1 | 7/2003 | Weaver |
| 2003/0198824 A1 | 10/2003 | Fong |
| 2004/0084686 A1 | 5/2004 | Wang |
| 2004/0104673 A1 | 6/2004 | Hosokawa |
| 2005/0170210 A1 | 8/2005 | Kim |
| 2005/0227114 A1 | 10/2005 | Tanaka |
| 2005/0249901 A1 | 11/2005 | Yializis |
| 2005/0285513 A1 | 12/2005 | Choi |
| 2006/0264526 A1 | 11/2006 | Klare |
| 2007/0009834 A1 | 1/2007 | Hasegawa |
| 2007/0159086 A1 | 7/2007 | Yu |
| 2008/0157656 A1 | 7/2008 | Liao |
| 2009/0289549 A1 | 11/2009 | Lee |
| 2010/0079062 A1 | 4/2010 | Michels |
| 2013/0240862 A1* | 9/2013 | Yoo ................ H01L 51/5246 257/40 |
| 2014/0027739 A1 | 1/2014 | van de Weijer et al. |
| 2014/0049825 A1 | 2/2014 | Van Mol et al. |

FOREIGN PATENT DOCUMENTS

| | | |
|---|---|---|
| CN | 1892427 A | 1/2007 |
| CN | 101825844 A | 9/2010 |
| EP | 1288251 A2 | 3/2003 |
| EP | 1288251 A3 | 12/2003 |
| EP | 2045660 A1 | 4/2009 |
| EP | 2166409 A2 | 3/2010 |
| JP | A 2003-096184 | 4/2003 |
| JP | A 2004-079291 | 3/2004 |
| JP | A 2004 210879 | 7/2004 |
| JP | A 2004-311385 | 11/2004 |
| JP | A 2005-353398 | 12/2005 |
| JP | A 2006 511664 | 4/2006 |
| JP | 2007 141685 A | 6/2007 |
| JP | A 2007-184279 | 7/2007 |
| JP | A 2007 186603 | 7/2007 |
| JP | A 2007 536169 | 12/2007 |
| JP | A 2008-536968 | 9/2008 |
| JP | A 2010 102328 | 5/2010 |
| KR | 20040073695 | 8/2004 |
| WO | WO 2008 117854 A1 | 10/2008 |
| WO | WO 2009/082061 | 7/2009 |

OTHER PUBLICATIONS

International Search Report from PCT/NL2011/050720, dated Jan. 4, 2012.
International Search Report from PCT/NL2011/050653, dated Aug. 6, 2012.
Liu and Cussler (2006) Journal of Membrane Sciences 285:56-67, "Barrier membranes made with lithographically printed flakes".
Wu, et al. (2010) Adsorption 16:69-74, "Flexible and transparent moisture getter film containing zeolite".
Office Action from CN 2015041501207520 dated Apr. 20, 2015 with English Translation.
Lape, et al. (2002) Journal of Membrane Science 209:271-282, "Flake-filled reactive membranes".
Office Action from JP13036 dated Jul. 28, 2015 with English Translation.
Office Action from JP2013-536549 dated Sep. 8, 2015 with English Translation.

* cited by examiner

OPTO-ELECTRIC DEVICE AND METHOD OF MANUFACTURING AN OPTO-ELECTRIC DEVICE

RELATED APPLICATIONS

This application is a 35 U.S.C. §371 national phase application of PCT/NL2011/050653 (WO 2012/057615 A2), filed on Sep. 27, 2011, entitled "Opto-Electric Device and Method of Manufacturing an Opto-Electric Device," which application claims priority to European Application Serial No. 10188765.1, filed Oct. 25, 2010, each of which is incorporated herein by reference in its entirety.

BACKGROUND

1. Field of the Invention

The present invention relates to an opto-electric device.

The present invention further relates to a method of manufacturing an opto-electric device.

2. Related Art

A new generation of organic thin film based devices, such as organic light-emitting diodes (OLEDs) for lighting and displays, thin film batteries, thin film organic solar cells, electrochromic foils, electrophoretic displays, etc., have the potential to become a next revolution in electronic systems.

An OLED comprises a light-emitting organic film that is formed between an electrode and a counter electrode. Usually the light-emitting organic film is part of a stack that may comprise additional layers, such as a hole transport layer, an electron block layer, an electron transport layer and a luminescent layer.

Various materials applied in OLEDs and other organic devices are sensitive to substances as moisture in the atmosphere. Accordingly a protection is required that block an ingression of such substances towards the organic device.

US2009289549A1 discloses an organic light emitting diode (OLED) display that includes a substrate, a subpixel on the substrate, and a multi-layered protective layer covering the subpixel. The multi-layered protective layer has a structure in which organic layers and inorganic layers are alternately stacked in a repeated manner and at least one moisture absorbing layer is interposed in the multi-layered protective layer. In an embodiment the organic light emitting diode comprises an organic layer between the moisture absorbing layer and an outer one of the inorganic layers.

SUMMARY

It is an object of the invention to provide an improved opto-electric device.

According to a first aspect of the present invention, an opto-electric device is provided as claimed in claim 1. The opto-electric device according to the first aspect of the present invention has a lateral diffusion layer, wherein the getter material is present in a separate getter layer arranged between the opto-electric element and the lateral diffusion layer and/or the getter material is present in the lateral diffusion layer. Nevertheless the opto-electric device may have an additional layer of getter material, for example between the lateral diffusion layer and the inorganic layer.

As used herein, a "layer" of a given material includes a region of that material whose thickness is small compared to both its length and width. Examples of layers include sheets, foils, films, laminations, coatings, and so forth. As used herein a layer need not be planar, but can be bent, folded or otherwise contoured, for example, to at least partially envelop another component.

A lateral diffusion layer is a layer that allows a relatively quick diffusion of volatile or liquid substances in lateral directions as compared to a transversal direction. The lateral diffuser layer is an organic layer having anisotropic particles, such as planar or linear inorganic particles that are aligned with the layer. In comparison to isotropically diffusing layers this allows said substances that locally penetrate through pinholes in the inorganic layer to diffuse laterally over a relatively large area before reaching the getter layer. Because the diffused substance reaches the getter material over a larger area than would be the case in an isotropically diffusing layer the diffused substance can be more efficiently gettered in the getter layer.

Without a diffuser layer, only getter material in an area with the size of a circle with a radius equal to the thickness of the getter layer can "catch" the moisture or other substance that has to be prevented from reaching the opto-electric element. After the getter in this semi-circle is saturated the water can reach the underlying structure leading to degradation. The presence of a diffuser layer between the inorganic layer and the getter layer or the presence of getter material in a diffuser layer results in a substantially better use of the getter capacity, allowing for a much greater lag time for water to reach the underlying structure.

The lateral diffusion layer typically comprises anisotropic particles, such as fiber or chip-like particles that are embedded in an organic layer. The fibers and/or chip-like particles obstruct the diffusion of moisture in the transverse direction, while the organic layer material in which these particles are embedded allow for a relatively efficient lateral diffusion.

To that end it is important that the anisotropic particles are aligned with the plane of the organic layer. I.e. the particles should extend in the plane of the organic layer. Examples of organic layers provided with aligned flakes suitable for this purpose, as well as their preparation are described by Cussler et al, in "Barrier membranes made with lithographic printed flakes", J. of Membrane Science 285 (2006) 56-67, and in "Polydisperse flakes in barrier films", J. of Membrane Science 236 (2004), 29-37. Cussler et al, also propose to provide such films in combination with reactive additives, for example in "Barrier films using flakes and reactive additives", Progress in Org. Coatings 46 (2003) 231-240, in "Flake-filled reactive membranes", J. of Membrane Science 209 (2002) 271-282, and in "Reactive barrier membranes: some theoretical observations regarding the time lag and breakthrough curves", J. of Membrane Science 229 (2004) 33-41. However, Cussler does not disclose the combination wherein a lateral diffusion layer is arranged between an inorganic layer and a layer having a getter function.

The getter material may be selected from physically adsorptive and chemically adsorptive dessicants. Physically-adsorptive desiccants include zeolite, silica gel, active alumina and activated charcoal. Of the physically adsorptive dessicants, zeolite is a preferred material.

Nevertheless chemically-adsorptive desiccants are preferred over physically adsorptive dessicants as chemically adsorptive dessicants adsorp the substances to be gettered substantially irreversibly. Chemically adsorptive dessicants may be selected from various substances include metaloxides such as calcium oxide, calcium chloride, magnesium sulfate, barium oxide, phosphorus pentaoxide, potassium hydroxide, sodium hydroxide, potassium bromide, calcium bromide, copper sulfate, zinc chloride, calcium sulfate and magnesium oxide. Especially, calcium oxide is preferred for this purpose.

However, also other getter materials may be used. Examples thereof are finely divided particles of metals selected from the group I or group II metals. Also molecular getters may be used.

In an embodiment the lateral diffusion layer comprises the getter material. Accordingly, moisture or another substance that penetrates a pinhole in the inorganic layer is partly lateral diffused and partly bound by the getter material. Moisture that is not immediately bound by the getter material is strongly spread laterally in the lateral diffusion layer so that it can be bound by a relatively large volume of getter material. This embodiment has the advantage that a single processing step suffices to achieve both functions of lateral diffusion of moisture and moisture gettering.

In a further embodiment the getter material is provided in a separate getter layer, the lateral diffusion layer being arranged between the getter layer and the inorganic layer. In this embodiment the getter material is optimally used in that moisture or other substances penetrating the inorganic layer diffuses first over a large area before it reaches the getter layer.

Different options are possible to apply the getter layer. According to a first option the desiccant layer is provided as a homogeneous layer of group I or group II metal or their oxides, such as BaO or CaO. Alternatively the desiccant layer may be formed as an organic layer mixed with molecular getters or still alternatively as an organic layer with finely dispersed (nano) particles of group I or group II metal or their oxides, such as BaO or CaO.

A getter layer may be obtained by deposition of a layer of a polymer solution containing a dispersion of the getter material and subsequently curing the layer so obtained.

Likewise a lateral diffusion layer may be obtained by deposition of a layer of a polymer solution containing a dispersion of anisotropic particles and subsequently curing the layer so obtained.

Likewise a lateral diffusion layer including getter particles may be obtained by deposition of a layer of a polymer solution containing a dispersion of anisotropic particles and getter particles and subsequently curing the layer so obtained.

Alignment of the anisotropic particles in the lateral diffusion layer or in the combined lateral diffusion/getter layer may be obtained by deposition of the layer as a plurality of sublayers and allowing each sublayer to cure before applying a next sublayer.

In some embodiments the anisotropic particles may not be perfectly aligned in the plane of the lateral diffusion layer. In that case a planarization layer of an organic material may be applied between the lateral diffusion layer and the inorganic layer to prevent that non-aligned particles protrude the inorganic layer. This also applies to embodiments wherein the lateral diffusion layer comprises getter particles that could protrude through the inorganic layer. The planarization layer may laterally extend beyond the lateral diffusion layer so that it also provides a protection of the inorganic layer against laterally extending particles.

According to a second aspect of the invention a method of manufacturing an opto-electric device is provided.

A first embodiment of a method according to the second aspect comprises the following steps in the order presented or in the reverse order providing an opto-electric element,
applying a getter layer,
applying a lateral diffusion layer comprising anisotropic particles that are aligned therewith,
applying an inorganic layer, said steps resulting in a stack subsequently comprising the opto-electric element, the getter layer, the lateral diffusion layer and the inorganic layer.

Additional method steps may be included before or after this sequence of steps or between subsequent ones of these steps. For example a step of applying an inorganic layer may be applied after the step of providing an opto-electric element and before the step of applying a getter layer. Or if the sequence of steps is performed in reverse order, a step of applying an inorganic layer may be applied after the step of applying a getter layer and before the step of providing an opto-electric element. In both cases the three steps result in a sub-stack comprising an inorganic layer arranged between a getter layer and an opto-electric element.

A second embodiment of a method according to the second aspect comprises the following steps in the order presented or in the reverse order providing an opto-electric element,
applying a lateral diffusion layer, the lateral diffusion layer comprising a mixture of moisture getter particles and anisotropic particles, the anisotropic particles being aligned with the lateral diffusion layer and,
applying an inorganic layer, said steps resulting in a stack subsequently comprising the opto-electric element, the getter layer, the lateral diffusion layer and the inorganic layer.

Additional method steps may be included before or after this sequence of steps or between subsequent ones of these steps. For example a step of applying an inorganic layer may be applied after the step of providing an opto-electric element and before the step of applying a lateral diffusion layer. Or if the sequence of steps is performed in reverse order, a step of applying an inorganic layer may be applied after the step of applying a lateral diffusion layer and before the step of providing an opto-electric element. In both cases the three steps result in a sub-stack comprising an inorganic layer arranged between a lateral diffusion layer and an opto-electric element.

BRIEF DESCRIPTION OF THE DRAWINGS

These and other aspects are described in more detail with reference to the drawing. Therein.

DETAILED DESCRIPTION OF EMBODIMENTS

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention. Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In case of conflict, the present specification, including definitions, will control. In addition, the materials, methods, and examples are illustrative only and not intended to be limiting.

Figure 1:
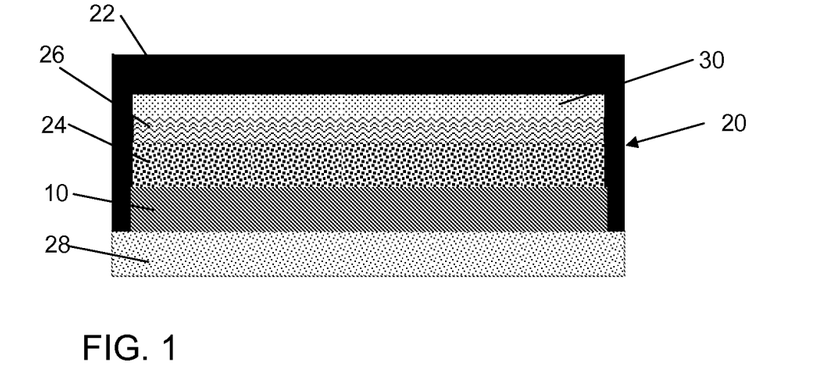
FIG. 1 shows a first embodiment of an opto-electric device according to the first aspect of the invention.

FIG. 1 schematically shows an opto-electric device comprising an opto-electric element 10 that is enclosed by a barrier structure 20 for inhibiting a transmission of moisture from an environment towards the opto-electric element 10. The barrier structure includes a stack of layers comprising at least an inorganic layer 22, as well as a getter layer 24 and a further layer 26 arranged between the inorganic layer 22 and the opto-electric element 10. The getter layer 24 is arranged closer towards the opto-electric element 10 than the further layer 26. The further layer 26 is a lateral diffusion layer. In the embodiment shown the barrier structure 20 further comprises a metal foil 28. The metal foil 28 and the stack 22, 24, 26 together encapsulate the opto-electric element 10. In the embodiment shown the opto-electric device further has an organic planarization layer 30 arranged between the lateral diffusion layer 26 and the inorganic layer 22. In a further embodiment the organic planarization layer 30 may also laterally extend beyond the lateral diffusion layer 26.

An inorganic layer 22 may be formed of any ceramic including but not limited to metal oxide, such as indium oxide (In2O3), tin oxide (SnO2), indium tin oxide (ITO), a metal nitride, such as aluminium nitride (AlN), silicon nitride (SiN), a carbide, such as silicon carbide, a metal oxynitride, e.g. siliconoxynitride, or any other combination such as metal oxy carbides, metal carbonitrides, metal oxycarbonitrides. In case that the electronic device has an optical function it is relevant that at least one side (foundation or cover) is of a substantially transparent ceramic. Suitable materials therefore are for example silicon oxide (SiO2), aluminum oxide (Al2O3), titanium oxide (TiO2), indium oxide (In2O3), tin oxide (SnO2), indium tin oxide (ITO, In2O3+SnO2), silicium carbide (SiC), silicon oxynitride (SiON) and combinations thereof. Other suitable materials are ZrO, AlON, Si3N4, ZnO and Ta2O5.

The at least one inorganic layer 22 has a water vapor transmission rate of at most $10^{-4}$ $g \cdot m^{-2} \cdot day^{-1}$. The inorganic layer should have a thickness in the range of 10 to 1000 nm, preferably in the range of 100 to 300 nm. An inorganic layer with a thickness less than 10 nm does in practice have insufficient barrier properties. Deposition of an inorganic layer with a thickness of at least 100 nm is preferred in that relatively large tolerances in the manufacturing process are allowed without having consequences for the quality of the product. For flexible products the thickness of the inorganic layers preferably does not exceed 300 nm. A thickness larger than 1000 nm does not further improve the barrier properties of the inorganic layer, while the duration of the deposition process is economically unattractive.

As described above, the lateral diffusion layer 26 typically comprises anisotropic particles, such as fiber or chip-like particles that are embedded in an organic layer and that are aligned with the plane of the organic layer. The fibers and/or chip-like particles obstruct the diffusion of moisture in the transverse direction, while the organic layer material in which these particles are embedded allow for a relatively efficient lateral diffusion.

Examples of anisotropic particles include glass flakes and clays, such as montmorillonite and bentonite clays, among which most preferred are nanoclays. Examples of preferred glassflakes include ECR glassflakes from Glassflake Ltd. such as GF001, GF002, GF003, and GF005. Examples of preferred clays include Cloisite 20A nanoclay from Rockwood and Nanomer PGV bentonite.

Other suitable materials for anisotropic particles may also include carbon particles and nanoparticles, such as carbon nanotubes, nanoribbons, nanofibres and any regular or irregular shaped carbon particles; unreactive metals such as copper, platinum, gold and silver; minerals such as wollastonite and mullite; rare earth elements; titanium carbide, zirconium carbide, zirconium nitride, silicon carbide, or silicon nitride, metal sulfides, and a mixture or combination thereof.

The resinous component of the organic layers is not particularly restricted provided that in organic layers comprising a getter material, the water-removing action of the getter material is not interfered with. Suitable organic materials for this purpose are for example, fluorine-containing resin, polyolefin resin, polyacrylic resin, polyacrylonitrile resin, polyamide resin, polyester resin, epoxy resin, polysiloxane resin, and polycarbonate resin.

Resins, e.g. polyolefins, may be applied by extrusion in molten form. Epoxy resins typically are thermally cured or cured at roomtemperature in two-component systems.

Among these resins, those that result from photocurable compositions comprising at least one radically curable compound and radical photoinitiator are preferred. The advantage of using photocurable compounds is that curing time is almost instantaneous.

The photocurable composition comprises one or more radically polymerizable compounds. The radically polymerizable compound is preferably ethylenically unsaturated, and is particularly preferably selected from compounds (mono-functional or polyfunctional compounds) having at least a terminal ethylenic unsaturated bond and more preferably two or more thereof. More specifically, it can be suitably selected from those widely known in the radiation curing industry, including those having a chemical structure of a monomer, a prepolymer (namely a dimer, a trimer, and an oligomer), a mixture thereof and a copolymer thereof.

Examples of radical polymerizable compounds include (meth)acrylates, (meth)acrylamides, aromatic vinylic compounds, vinyl ethers and compounds having an internal double bond (such as maleic acid). In the expression, "(meth)acrylate" refers to an acrylate, a methacrylate, or a mixture thereof, "(meth)acryl" refers to an acryl, a methacryl, or a mixture thereof.

Examples of (meth)acrylates include those shown below.

Specific examples of mono functional (meth)acrylate include hexyl (meth)acrylate, 2-ethylhexyl (meth)acrylate, tert-octyl (meth)acrylate, isoamyl (meth)acrylate, decyl (meth)acrylate, isodecyl (meth)acrylate, stearyl (meth)acrylate, isostearyl (meth)acrylate, cyclohexyl (meth)acrylate, 4-n-butylcyclohexyl (meth)acrylate, bornyl (meth)acrylate, isobornyl (meth)acrylate, benzyl (meth)acrylate, 2-ethylhexyl diglycol (meth)acrylate, butoxyethyl (meth)acrylate, 2-chloroethyl (meth)acrylate, 4-bromobutyl (meth)acrylate, butoxymethyl (meth)acrylate, 3-methoxybutyl (meth)acrylate, alkoxymethyl (meth)acrylate, alkoxyethyl (meth)acrylate, 2-(2-methoxyethoxy)ethyl (meth)acrylate, 2-(2-butoxyethoxy)ethyl (meth)acrylate, 2,2,2-trifluoroethyl (meth)acrylate, 1H,1H,2H,2H-perfluorodecyl (meth)acrylate, 4-butylphenyl (meth)acrylate, phenyl (meth)acrylate, 2,3,4,5-tetramethylphenyl (meth)acrylate, 4-chlorophenyl (meth)acrylate, phenoxymethyl (meth)acrylate, phenoxyethyl (meth)acrylate, glycidyl (meth)acrylate, glycidyloxybutyl (meth)acrylate, glycidyloxyethyl (meth)acrylate, glycidyloxypropyl (meth)acrylate, tetrahydrofurfuryl (meth)acrylate, hydroxyalkyl (meth)acrylate, 2-hydroxyethyl (meth)acrylate, 3-hydroxypropyl (meth)acrylate, 2-hydroxypropyl (meth)acrylate, 2-hydroxybutyl (meth)acrylate, 4-hydroxybutyl (meth)acrylate, dimethylaminoethyl (meth)acrylate, diethylaminoethyl (meth)acrylate, dimethylaminopropyl (meth)acrylate, diethylaminopropyl (meth)acrylate, trimethoxysilylpropyl (meth)acrylate, trimethylsilylpropyl (meth)acrylate, polyethylene oxide monomethyl ether (meth)acrylate, oligoethylene oxide monomethyl ether (meth)acrylate, polyethylene oxide (meth)acrylate, oligoethylene oxide (meth)acrylate, oligoethylene oxide monoalkyl ether (meth)acrylate, polyethylene oxide monoalkyl ether (meth)acrylate, dipropylene glycol (meth)acrylate, polypropylene oxide monoalkyl ether (meth)acrylate, oligopropylene oxide monoalkyl ether (meth)acrylate, 2-methacryloyloxyethylsuccinic acid, 2-methylacryloyloxyhexahydrophthalic acid, 2-methacryloyloxyethyl-2-hydroxypropyl phthalate, butoxydiethylene glycol (meth)acrylate, trifluoroethyl (meth)acrylate, perfluorooctylethyl (meth)acrylate, 2-hydroxy-3-phenoxypropyl (meth)acrylate, EO-denatured phenol (meth)acrylate, EO-denatured cresol (meth)acrylate, EO-denatured nonylphenol (meth)acrylate, PO-denatureed nonylphenol (meth)acrylate, and EO-denatured 2-ethylhexyl (meth)acrylate.

Specific examples of bifunctional (meth)acrylate include 1,6-hexanediol di(meth)acrylate, 1,10-decanediol di(meth)acrylate, 1,12-dodecanediol di(meth)acrylate, neopentyl glycol di(meth)acrylate, 2,4-dimethyl-1,5-pentanediol di(meth)acrylate, butylethylpropanediol (meth)acrylate, ethoxylated cyclohexanemethanol di(meth)acrylate, polyethylene glycol di(meth)acrylate, oligoethylene glycol di(meth)acrylate, ethylene glycol di(meth)acrylate, 2-ethyl-2-butyl-butanediol di(meth)acrylate, neopentyl glycol hydroxypivalate di(meth)acrylate, EO-denatured bisphenol-A di(meth)acrylate, bisphenol-F polyethoxy di(meth)acrylate, polypropylene glycol di(meth)acrylate, oligopropylene glycol di(meth)acrylate, 1,4-butanediol di(meth)acrylate, 2-ethyl-2-butylpropanediol di(meth)acrylate, 1,9-nonane di(meth)acrylate, propoxylated ethoxylated bisphenol-A di(meth)acrylate, and tricyclodecane di(meth)acrylate.

Specific examples of trifunctional (meth)acrylate include trimethylolpropane tri(meth)acrylate, trimethylolethane tri(meth)acrylate, alylene oxide-denatured tri(meth)acrylate of trimethylolpropane, pentaerythritol tri(meth)acrylate, dipentaerythritol tri(meth)acrylate, trimethylolpropane tris((meth)acryloyloxypropyl)ether, alkylene-denatured tri(meth)acrylate of isocyanuric acid, dipentaerythritol propionate tri(meth)acrylate, tris((meth) acryloyloxyethyl)isocyanurate, hydroxypivalyl aldehyde-denatured dimethylolpropane tri(meth)acrylate, sorbitol tri(meth)acrylate, propoxylated trimethylolpropane tri(meth)acrylate, and ethoxylated glycerin triacrylate.

Specific examples of tetrafunctional (meth)acrylate include pentaerythritol tetra(meth)acrylate, sorbitol tetra(meth)acrylate, ditrimethylolpropane tetra(meth)acrylate, dipentaerythritol propionate tetra(meth)acrylate, and ethoxylated pentaerythritol tetra(meth)acrylate.

Specific examples of pentafunctional (meth)acrylate include sorbitol penta(meth)acrylate, and dipentaerythritol penta(meth)acrylate.

Specific examples of hexafunctional (meth)acrylate include dipentaerythritol hexa(meth)acrylate, sorbitol hexa(meth)acrylate, alkylene oxide-denatured hexa(meth)acrylate of phosphazene, and captolactone-denatured dipentaerythritol hexa(meth)acrylate.

Unsaturated (poly)urethanes may be used. The unsaturated (poly)urethane is an unsaturated urethane compound or an unsaturated (poly)urethane compound having at least one polymerizable carbon-carbon unsaturated bond in the molecule. Unsaturated (poly)urethanes may be prepared by, e.g., reacting a hydroxyl-terminated (poly)urethane with (meth) acrylic acid, or by reacting an isocyanate-terminated prepolymer with hydroxyalkyl (meth)acrylates to give an urethane methacrylate.

Examples of preferred aliphatic urethane methacrylates include GenomerR 4205, GenomerR 4256 and GenomerR 4297, or those described in U.S. Pat. No. 6,277,929.

Furthermore, higher functionality methacrylates, including hyberbranched polyester types, may also be used.

Examples of (meth)acrylamides include (meth)acrylamide, N-methyl(meth)acrylamide, N-ethyl(meth)acrylamide, N-propyl(meth)acrylamide, N-n-butyl(meth)acrylamide, N-t-butyl(meth) acrylamide, N-butoxymethyl(meth) acrylamide, N-isopropyl(meth) acrylamide, N-methylol (meth)acrylamide, N,N-dimethyl(meth)acrylamide, N,N-diethyl(meth)acrylamide, and (meth)acryloylmorpholine.

Specific examples of aromatic vinyl compound include styrene, methylstyrene, dimethylstyrene, trimethylstyrene, ethylstyrene, isopropylstyrene, chloromethylstyrene, methoxystyrene, acetoxystyrene, chlorostyrene, dichlorostyrene, bromostyrene, vinylbenzoic acid methyl ester, 3-methylstyrene, 4-methylstyrene, 3-ethylstyrene, 4-ethylstyrene, 3-propylstyrene, 4-propylstyrene, 3-butylstyrene, 4-butylstyrene, 3-hexylstyrene, 4-hexylstyrene, 3-octylstyrene, 4-octylstyrene, 3-(2-ethylhexyl)styrene, 4-(2-ethylhexyl)styrene, allylstyrene, isopropenylstyrene, butenylstyrene, octenylstyrene, 4-t-butoxycarbonylstyrene, 4-methoxystyrene, and 4-t-butoxystyrene.

Specific examples of the vinyl ethers, in the case of a monofunctional vinyl ether, include methyl vinyl ether, ethyl vinyl ether, propyl vinyl ether, n-butyl vinyl ether, t-butyl vinyl ether, 2-ethylhexyl vinyl ether, n-nonyl vinyl ether, lauryl vinyl ether, cyclohexyl vinyl ether, cyclohexylmethyl vinyl ether, 4-methylcyclohexylmethyl vinyl ether, penzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxypolyethylene glycol vinyl ether, tetrahydrofurfuryl vinyl ether, 2-hydroxyethyl vinyl ether, 2-hydroxypropyl vinyl ether, 4-hydroxybutyl vinyl ether, 4-hydroxymethylcyclohexylmethyl vinyl ether, diethylene glycol monovinyl ether, polyethylene glycol vinyl ether, chloroethyl vinyl ether, chlorobutyl vinyl ether, chloroethoxyethyl vinyl ether, phenylethyl vinyl ether, and phenoxypolyethylene glycol vinyl ether.

Also examples of polyfunctional vinyl ether include divinyl ethers such as ethylene glycol divinyl ether, diethylene glycol divinyl ether, polyethylene glycol divinyl ether, propylene glycol divinyl ether, butylene glycol divinyl ether, hexanediol divinyl ether, bisphenol-A alkylene oxide divinyl ether, and bispenol-F alkylene oxide divinyl ether; and polyfunctional vinyl ethers such as trimethylolethane trivinyl ether, trimethylolpropane trivinyl ether, ditrimethylolpropane tetravinyl ether, glycerin trivinyl ether, pentaerythritol tetravinyl ether, dipentaerythritol pentavinyl ether, dipentaerythritol hexavinyl ether, ethylene oxide-added trimethylolpropane trivinyl ether, propylene oxide-added trimethylolpropane trivinyl ether, ethylene oxide-added ditrimethylolpropane tetravinyl ether, propylene oxide-added ditrimethylolpropane tetravinyl ether, ethylene oxide-added pentaerythritol tetravinyl ether, propylene oxide-added pentaerythritol tetravinyl ether, ethylene oxide-added dipentaerythritol hexavinyl ether, and propylene oxide-added dipentaerythritol hexavinyl ether.

In addition, the photocurable composition comprises at least one free radical photoinitiator. The free radical photoinitiator may be chosen from those commonly used to initiate radical photopolymerization. Examples of free radical photoinitiators include benzoins, e.g., benzoin, benzoin ethers such as benzoin methyl ether, benzoin ethyl ether, benzoin isopropyl ether, benzoin phenyl ether, and benzoin acetate; acetophenones, e.g., acetophenone, 2,2-dimethoxyacetophenone, and 1,1-dichloroacetophenone; benzil ketals, e.g., benzil dimethylketal and benzil diethyl ketal; anthraquinones, e.g., 2-methylanthraquinone, 2-ethylanthraquinone, 2-tertbutylanthraquinone, 1-chloroanthraquinone and 2-amylanthraquinone; triphenylphosphine; benzoylphosphine oxides, e.g., 2,4,6-trimethylbenzoy-diphenylphosphine oxide (Lucirin TPO); bisacylphosphine oxides; benzophenones, e.g., benzophenone and 4,4'-bis(N,N'-dimethylamino)benzophenone; thioxanthones and xanthones; acridine derivatives; phenazine derivatives; quinoxaline derivatives; 1-phenyl-1,2-propanedione 2-O-benzoyl oxime; 4-(2-hydroxyethoxy)phenyl-(2-propyl)ketone (Irgacure® 2959); 1-aminophenyl ketones or 1-hydroxy phenyl ketones, e.g., 1-hydroxycyclohexyl phenyl ketone, 2-hydroxyisopropyl phenyl ketone, phenyl 1-hydroxyisopropyl ketone, and 4-isopropylphenyl 1-hydroxyisopropyl ketone, and combinations thereof.

The content of the polymerization initiator is preferably within a range from 0.01 to 10% by mass with respect to the polymerizable material, more preferably from 0.5 to 7% by mass.

The photocurable composition may be a thiol-ene system. Therefore, the resin composition may comprise at least a monofunctional or multifunctional thiol in addition to the (meth)acrylate components and free radical photoinitiator. Multifunctional thiol means a thiol with two or more thiol groups. A multifunctional thiol may be a mixture of different multifunctional thiols. Suitable multifunctional thiols are described in U.S. Pat. No. 3,661,744 at Col. 8, line 76-Col. 9, line 46; in
U.S. Pat. No. 4,119,617, Col. 7, lines 40-57; U.S. Pat. Nos. 3,445,419; and 4,289,867. Especially preferred are multifunctional thiols obtained by esterification of a polyol with an .alpha. or s-mercaptocarboxylic acid such as thioglycolic acid, or s-mercaptopropionic acid.

Examples of thiols include pentaerythritol tetra-(3-mercaptopropionate) (PETMP), pentaerythritol tetrakis(3-mercaptobutylate) (PETMB), trimethylolpropane tri-(3-mercaptopropionate) (TMPMP), glycol di-(3-mercaptopropionate) (GDMP), pentaerythritol tetramercaptoacetate (PETMA), trimethylolpropane trimercaptoacetate (TMPMA), glycol dimercaptoacetate (GDMA), ethoxylated trimethylpropane tri(3-mercapto-propionate) 700 (ETTMP 700), ethoxylated trimethylpropane tri(3-mercapto-propionate) 1300 (ETTMP 1300), propylene glycol 3-mercaptopropionate 800 (PPGMP 800).

The photocurable composition may comprise one or more cationically polymerizable epoxy polysiloxane compounds.

Examples of such epoxy polysiloxane components are: Bis[2-(3,4-epoxycyclohexyl)ethyl]tetramethyldisiloxane, 1,3-bis(glycidoxypropyl) tetramethyldisiloxane, epoxypropoxypropyl terminated polydimethylsiloxanes, epoxypropoxypropyl terminated polyphenylmethylsiloxanes, (epoxypropoxypropyl)dimethoxysilyl terminated polydimethylsiloxanes, mono-(2,3-epoxy)propylether terminated polydimethylsiloxane, epoxycyclohexylethyl terminated polydimethylsiloxanes.

The following are examples of commercially available epoxy polysiloxane components: DMS-E12, DMS-E21, DMS-EX21, MCR-E11, MCR-E21, DMS-EC13, SIB1115.0 (Gelest); UV9200 (Momentive), Silcolease UV POLY220, Silcolease UV POLY200, Silcolease UV POLY201 (Bluestar), PC1000, PC1035 (Polyset).

Therefore, the resin composition may comprise epoxy and/or oxetane functional organic compounds to modify cure performance, adhesion, mechanical properties, and viscosity. Epoxy functional organic compounds include for example epoxidized polybutadiene resins, limoneneoxide, 4-vinylcyclohexeneoxide, allylglycidyl ether, 7-epoxy-1-octene, vinylcyclohexenedioxide, bis(2,3-epoxycyclopentyl)ether, 3,4-epoxycyclohexylmethyl-3,4-epoxycyclohexanecarboxylate, cresylglycidyl ether, butanedioldiglycidyl ether and the like. Mixtures of such epoxides are also suitable. Oxetane functional organic compounds include for example 3-ethyl-3-((2-ethylhexyloxy)methyl)oxetane, trimethylolpropane oxetane.

In addition, the photocurable composition comprises at least one cationic photoinitiator.

Examples of cationic photoinitiators include, but are not limited to, onium salts, diaryliodonium salts of sulfonic acids, triarylsulfonium salts of sulfonic acids, diaryliodonium salts of boronic acids, and triarylsulfonium salts of boronic acids, having non-nucleophilic anions such as hexafluorophosphate, hexafluoroantimonate, tetrafluoroborate and hexafluoroarsenate, tetra(pentafluorophenyl)borate.

The cationic photoinitiator can be present in the coating composition in an amount ranging from about 0.01 to 10%, preferably from 0.1 to 5% weight percent, more preferably from 0.5 to 3% based on the total weight of the coating composition.

The onium salts are positively charged, usually with a value of +1, and a negatively charged counterion is present. Suitable onium salts include salts having a formula selected from $R^9_2I+MX_z^-$, $R^9_3S+MX_z^-$, $R^9_3Se^+ MX_z^-$, $R^9_4P+MX_z^-$, and $R^9_4N+MX_z^-$, wherein each $R^9$ is independently hydrocarbyl or substituted hydrocarbyl having from 1 to 30 carbon atoms; M is an element selected from transition metals, rare earth metals, lanthanide metals, metalloids, phosphorus, and sulfur; X is a halo (e.g., chloro, bromo, iodo), and z has a value such that the product of z times (charge on X+oxidation number of M)=−1. Examples of substituents on the hydrocarbyl group include, but are not limited to, $C_1$ to $C_8$ alkoxy, $C_1$ to $C_{16}$ alkyl, nitro, chloro, bromo, cyano, carboxyl, mercapto, and heterocyclic aromatic groups, such as pyridyl, thiophenyl, and pyranyl. Examples of metals represented by M include, but are not limited to, transition metals, such as Fe, Ti, Zr, Sc, V, Cr, and Mn; lanthanide metals, such as Pr, and Nd; other metals, such as Cs, Sb, Sn, Bi, Al, Ga, and In; metalloids, such as B, and As; and P. The formula $MX_z^-$ represents a non-basic, non-nucleophilic anion. Examples of anions having the formula $MX_z^-$ include, but are not limited to, $BF_4^-$, $PF_6^-$, $AsF_6^-$, $SbF_6^-$, $SbCl_6^-$, and $SnCl_6^-$. Examples of onium salts include, but are not limited to, bis-diaryliodonium salts, such as bis(dodecylphenyl)iodonium hexafluoroarsenate, bis(dodecylphenyl)iodonium hexafluoroantimonate, and dialkylphenyliodonium hexafluoroantimonate.

Examples of diaryliodonium salts of sulfonic acids include, but are not limited to, diaryliodonium salts of perfluoroalkylsulfonic acids, such as diaryliodonium salts of perfluorobutanesulfonic acid, diaryliodonium salts of perfluoroethanesulfonic acid, diaryliodonium salts of perfluorooctanesulfonic acid, and diaryliodonium salts of trifluoromethanesulfonic acid; and diaryliodonium salts of aryl sulfonic acids, such as diaryliodonium salts of para-toluenesulfonic acid, diaryliodonium salts of dodecylbenzenesulfonic acid, diaryliodonium salts of benzenesulfonic acid, and diaryliodonium salts of 3-nitrobenzenesulfonic acid.

Examples of triarylsulfonium salts of sulfonic acids include, but are not limited to, triarylsulfonium salts of perfluoroalkylsulfonic acids, such as triarylsulfonium salts of perfluorobutanesulfonic acid, triarylsulfonium salts of perfluoroethanesulfonic acid, triarylsulfonium salts of perfluorooctanesulfonic acid, and triarylsulfonium salts of trifluoromethanesulfonic acid; and triarylsulfonium salts of aryl sulfonic acids, such as triarylsulfonium salts of para-toluenesulfonic acid, triarylsulfonium salts of dodecylbenzenesulfonic acid, triarylsulfonium salts of benzenesulfonic acid, and triarylsulfonium salts of 3-nitrobenzenesulfonic acid.

Examples of diaryliodonium salts of boronic acids include, but are not limited to, diaryliodonium salts of perhaloarylboronic acids. Examples of triarylsulfonium salts of boronic acids include, but are not limited to, triarylsulfonium salts of perhaloarylboronic acid. Diaryliodonium salts of boronic acids and triarylsulfonium salts of boronic acids are well known in the art, as exemplified in European Patent Application No. EP 0562922.

Examples of commercial cationic photoinitiators include UV9390C, UV9380C (manufactured by Momentive), Irgacure 250 (BASF), Rhodorsil 2074, Rhodorsil 2076 (Rhodia), Uvacure 1592 (UCB Chemicals), Esacure 1064 (Lamberti). Most preferred are UV9390C and Rhodorsil 2074.

In an embodiment of the opto-electric device one or more organic layers are obtained by curing with actinic radiation, e.g. with UV-radiation, a photocurable resin composition comprising:

(A) at least one aromatic acrylate or methacrylate component, or any mixture thereof;
(B) at least one monofunctional acrylate, methacrylate, vinylamide, acrylamide or methacrylamide component, preferably with a viscosity below 100 mPa·s at 30° C., or any mixture thereof;
(C) at least one photoinitiator, or any mixture thereof.

In an embodiment of said embodiment the photocurable resin composition comprises:
(A) 30-90% by weight of the aromatic acrylate or methacrylate component A;
(B) 1-30% by weight of the monofunctional acrylate, methacrylate, vinylamide, acrylamide or methacrylamide component B;
(C) 0.1-10% by weight of the photoinitiator C;
based on the total weight of the resin composition.

In an embodiment of the opto-electric device one or more organic layers are obtained by curing with actinic radiation a photocurable resin composition comprising:
(D) at least one polybutadiene acrylate or methacrylate component, or any mixture thereof;
(E) at least one acrylate or methacrylate component not exhibiting polybutadiene groups, preferably with a viscosity below 100 mPa·s at 30° C., or any mixture thereof;
(C) at least one photoinitiator, or any mixture thereof.

In an embodiment of said embodiment the photocurable resin composition comprises:
(D) 10-60% by weight of the polybutadiene acrylate or methacrylate component D;
(E) 1-89.9% by weight of the acrylate or methacrylate component E;
(C) 0.1-10% by weight of the photoinitiator C;
based on the total weight of the resin composition.

In an embodiment of the opto-electric device one or more organic layers are obtained by curing with actinic radiation a photocurable resin composition comprising:
(F) at least one urethane acrylate or methacrylate component, or any mixture thereof;

(E) at least one acrylate or methacrylate component not exhibiting urethane groups, preferably with a viscosity below 100 mPa·s at 30° C., or any mixture thereof;
(C) at least one photoinitiator, or any mixture thereof.

In an embodiment of said embodiment the photocurable resin composition comprises:
(F) 5-50% by weight of the urethane acrylate or methacrylate component F;
(E) 1-94.9% by weight of the acrylate or methacrylate component E;
(C) 0.1-10% by weight of the photoinitiator C;
based on the total weight of the resin composition.

In an embodiment of the opto-electric device one or more organic layers are obtained by curing with actinic radiation a photocurable resin composition comprising:
(G) at least one acrylate or methacrylate component, or any mixture thereof with a clogP value >2;
(H) at least one thiol component, or any mixture thereof;
(C) at least one photoinitiator, or any mixture thereof.

In an embodiment of said embodiment the photocurable resin composition comprises:
(G) 20-98.9% by weight of the acrylate or methacrylate component G;
(H) 1-20% by weight of the thiol component H;
(C) 0.1-10% by weight of the photoinitiator C;
based on the total weight of the resin composition.

In an embodiment of the opto-electric device one or more organic layers are obtained by curing with actinic radiation a photocurable resin composition comprising:
(I) at least one epoxy polysiloxane component;
(J) at least one cationic photoinitiator, or any mixture thereof.

In an embodiment of said embodiment the photocurable resin composition comprises:
(I) 20-99.9% by weight of the epoxy polysiloxane component I;
(K) 0.2-79.9% by weight of an epoxy or oxetane functional organic component or mixture of epoxy or oxetane functional organic components not exhibiting polysiloxane groups.
(J) 0.1-10% by weight of the photoinitiator J;
based on the total weight of the resin composition.

Said one or more organic layers may comprise for example the lateral diffusion layer a layer containing getter material, or planarization layers.

It is noted that the composition comprising a cationic photoinitiator should only be used in combination with getter materials having a relatively low basicity. Getter materials having a relatively high basicity, such as CaO could suppress the cationic photocuring process.

In an embodiment of the multi-layered protective layer according to the first aspect the first organic layer and/or the second organic layer are obtained by curing with actinic radiation a photocurable resin composition with a clogP value >2.

Figure 8:
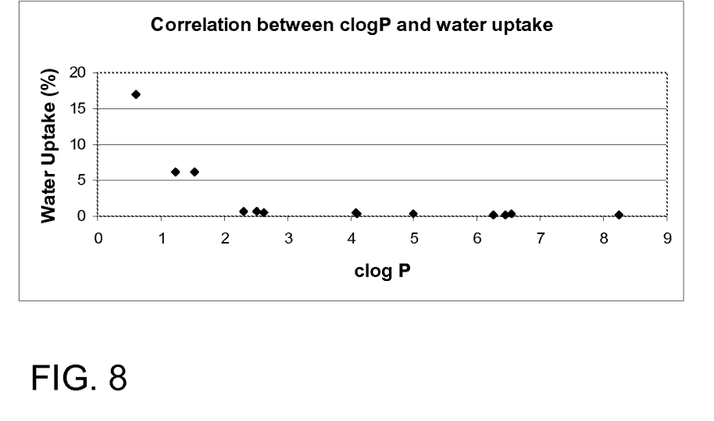
FIG. 8 shows experimental data relating to hydrophobicity of various organic materials.

Preferably compounds having a high hydrophobicity are used for the organic layers. A good indicator for the hydrophobicity is ClogP i.e. the calculated logarithm of the octanol/water partition coefficient. A relatively high ClogP value indicates a relatively high hydrophobicity of the material. This is illustrated in FIG. 8, which shows experimental results obtained for a relation between the wateruptake and the clogP value of various organic materials. In particularly it can be seen that organic materials having a clogP value of at least 2 show a very low water uptake. Accordingly, for the purpose of the present invention organic materials having a ClogP value of at least 2 are particular suitable. The ClogP value is a well-known parameter and may be calculated for any given molecule from a knowledge of the structure of that molecule. There are a number of commercially-available computer programs that can do this, for example, Osiris Property Explorer (http://www.organic-chemistry.org/prog/peo/), which is an integral part of Actelion's inhouse substance registration system. It is implemented as increment system adding contributions of every atom based on its atom type, the atom connectivity and chemical bonding.

In particular the following compositions comprising have been found suitable in view of a high ClogP value: Siloxanes, a mixture of siloxanes in the range of 70 to 80 wt % and oxetanes in the range of 20 to 30 wt %, a mixture of acrylates in the range of 85% to 95% with at least 5 wt % of a thiol or an oxytane or a mixture of one or more acrylates in the range of 40 to 85 wt % and a polybutadiene acrylate in the range of 10 to 55%, optionally with 1 to 10% of a thiol. Further additives, such as a photoinitiator may be present to an amount of 5 wt %.

Some examples of such compositions for materials having a ClogP value of at least 2 are given in the following table (nrs in weight %).

TABLE 1

Exemplary compositions of materials having a ClogP value of at least 2

| typename | F1 | F2 | F3 | F4 | F5 | F6 | F7 | F8 | F9 | F10 |
|---|---|---|---|---|---|---|---|---|---|---|
| PC1035 | 78 | | | | | | | | | |
| PC1000 | 20 | | | | | 75 | 51.9 | | | 75 |
| UV9390C | 2 | | | | | 2 | 2 | | | |
| CN301 | | 50 | | | | | | | | |
| CD262 | | 48 | 49 | 47 | 88 | | | | | |
| Irgacure 819 | | 2 | | | | | | | | |
| SR307 | | | 50 | 47 | | | | | | |
| Lucirin TPO-L | | | 1 | 1 | 2 | | | 2 | 2 | |
| PETMP | | | | 5 | 10 | | | 10 | | |
| oxt 212 | | | | | | 23 | 23 | | 5 | |
| PolyBD 600E | | | | | | | 23 | | | |
| Dynasylan | | | | | | | | 0.1 | | |
| Glymo | | | | | | | | | | |
| SR833S | | | | | | | | 70 | 93 | |
| SR506D | | | | | | | | 18 | | |
| oxt 101 | | | | | | | | | | 23 |
| Esacure 1064 | | | | | | | | | | 2 |

The meaning of the typenames is further specified in the following table.

TABLE 2

Specification of typenames

| typename | manufacturer | chemical name |
|---|---|---|
| | | Acrylate |
| CD262 | Sartomer | 1,12 Dodecanediol dimethacrylate |
| SR833S | Sartomer | Acrylate Ester Tricyclodecane Dimethanol Diacrylate |
| SR506D | Sartomer | Isobornyl Acrylate |
| | | Polybutadiene Acryl/Methacrylate |
| CN301 | Sartomer | Polybutadiene Dimethacrylate/Monomer Blend |
| SR307 | Sartomer | Polybutadiene Dimethacrylate |
| | | Siloxane |
| PC1035 | Polyset | epoxyslicone monomer |
| PC1000 | Polyset | epoxyslicone monomer |
| | | Polybutadiene Epoxy |
| PolyBD 600E | Sartomer | Hydroxilated, epoxidized polybutadiene |
| | | Oxetane |
| oxt 212 | Toago Sei | 3-Ethyl-3(2-ethylhexyloxymethyl)oxetane |
| oxt 101 | Toago Sei | Trimethylolpropane oxetane |

TABLE 2-continued

Specification of typenames

| typename | manufacturer | chemical name |
|---|---|---|
| | | Photoinitiator |
| UV9390C | Momentive | Mixture of Bis(4-dodecylphenyl)iodonium hexafluoroantimonate and oxirane, mono [(C12-14-alkyloxy)methyl]derivatives |
| Irgacure 819 | BASF | Phenyl bis (2,4,6-trimethylbenzoyl) phosphine oxide |
| Lucirin TPO-L | BASF | dihenyl (2,4,6-trimethylbenzoyl) phosphine oxide |
| Esacure 1064 | Lamberti | Triarylsulfonium hexafluorophosphate mixture |
| | | Additives |
| Dynasylan Glymo | Degussa | 3-Glycidyloxypropyltrimethoxysilane |

As described above, different options are possible to apply the getter layer. According to a first option the desiccant layer is provided as a homogeneous layer of group I or group II metal or their oxides, such as BaO or CaO. Alternatively the desiccant layer may be formed as an organic layer mixed with molecular getters or still alternatively as an organic layer with finely dispersed (nano) particles of group I or group II metal or their oxides, such as BaO or CaO. Such nano-particles are commercially available. In one embodiment CaO nanopowder was obtained from Strem Chemicals (Catalog #20-1400) having the following product specifications: Specific Surface Area (BET): ≥20 m2/g; Bulk Density: 0.5 g/cc; Crystallite Size: ≤40 nm; True Density: 3.3 g/cc; Average Pore Diameter: 165 Å; Mean Aggregate Size: 4 µm; Total Pore Volume: ≥0.1 cc/g; Ca Content (Based on Metal): >99.8%. In another embodiment MgO nanopowder (Catalog Nr.12-1400) from Strem was obtained having the following specifications: Specific Surface Area (BET): ≥230 $m^2$/g; True Density: 3.2 g/cc; Crystallite Size: ≤8 nm; Mean Aggregate Size: 3.3 µm; Average Pore Diameter: 50 Å; Loss on Ignition: ≤8%; Total Pore Volume: ≥0.2 cc/g; Moisture Content: ≤1%; Bulk Density: 0.6 g/cc; Mg Content (Based on Metal): ≥95%.

In other embodiments the getter layer may be formed by an active polymeric barrier layer which can actively bind and therefore neutralize permeants like moisture and oxidizing agents. This binding can take place by e.g. chemi- or physisorption of the permeants. Typically an active polymeric barrier layer is much easier to process than the conventional inorganic getter materials and can, for example, be deposited over the top electrode of the functional stack of the organic electronic device as a liquid or paste, planarizing the topographical steps normally present in the organic functional area.

The active polymeric barrier layer is preferably selected from a polymeric matrix with dispersed cyclodextrines, cyclic olefin copolymers, a polymeric matrix with anhydrides and mixtures thereof. Cyclodextrines are cyclic oligomers of a-D-glucose formed by the action of certain enzymes such as cyclodextrin gluco-transferases. The cyclodextrines consist of six, seven or eight a-1,4-linked glucose monomers and are known as a-, or y-cyclodextrines. The cyclodextrine molecules are orientated in a special manner relative to each other so that continuous channels are formed within the crystal lattice of the cyclodextrines. These channels have large hollow interiors of a specific volume and are therefore able to bind permeants e.g. gas molecules. The permeants can even be linked covalently to the cyclodextrine molecules, for example, by the primary hydroxyl groups at the six-carbon positions of the glucose moiety and the secondary hydroxyl group in the two- and three-carbon positions of the molecule. These hydroxyl groups can also be replaced by other groups in order to change the solubility, compatibility and the thermostability of the cyclodextrines. The substitution of the hydroxyl groups can also be used to adjust the binding strength to a value lying between the binding strength of cyclodextrines and of potential permeants. Therefore the cyclodextrines are able to permanently neutralize, for example, moisture or oxidizing agents. Preferably cyclodextrines are dispersed in a polymeric matrix like polypropylene.

The cyclic olefin copolymers can, for example, comprise two components which are blended by extrusion. One component can, for example, be an oxidizable polymer, like poly (ethylene-/methylacrylate/cyclohexenyl-methylacrylate) (EMCM). The second component can for example, consist of a photoinitiator and a catalyst, for example of a transition metal catalyst.

In other embodiments the active polymeric barrier layer comprises an organic composition that does not generate an acidic proton when subjected to hydrolysis. Preferably, the organic composition is selected from the group consisting of oxazolidines, derivatives thereof, cyanoacrylates, and isocyanates.

The choice of such a moisture scavenging agent ensures that the scavenging agent is advantageously dissolved in the organic material. Hence, no dispersion of nanoparticles in the organic material is required, which would be the case if inorganic scavenging agents (such as CaO) were to be used. The fact that the scavenging agent does not generate an acidic proton when subjected to hydrolysis, as is the case for well known anhydride-based organic moisture scavengers has the advantage that no highly reactive and mobile protons remain after the scavenging reaction.

A getter layer may be obtained by deposition of a layer of a polymerizable solution containing a dispersion of the getter material and subsequently curing the layer so obtained.

A dispersant may be added in order to increase dispersibility of getter particles or of anisotropic particles into the organic matrix. The dispersant may be a low molecular weight organic dispersant, a high molecular weight organic dispersant, a low molecular weight organic/inorganic complex dispersant, a high molecular weight organic/inorganic complex dispersant, an organic/inorganic acid, or the like. The dispersant is to disperse the getter particles well in the organic layer, for example, by avoiding aggregation, and thus minimize the size of the getter particles, to eventually make them exist on the order of nm to make a transparent moisture absorption layer.

The photocurable composition may additionally include other components, for example, stabilizers, modifiers, tougheners, antifoaming agents, leveling agents, thickening agents, flame retardants, antioxidants, pigments, dyes, fillers, and combinations thereof.

The effect of the present invention is now illustrated with reference to FIGS. 2A and 2B. Although inorganic layers generally form an effective barrier for water vapor, the remaining diffusion through the inorganic barrier layer is not uniform, but takes place through isolated pinholes. Typically a barrier layer may have such pinholes distributed at a density of $10^4/m^2$. Accordingly, in that case the average distance between the pinholes is in the order of 1 cm. By way of example FIGS. 2A and 2B show one such pinhole 22a.

Figure 2A:
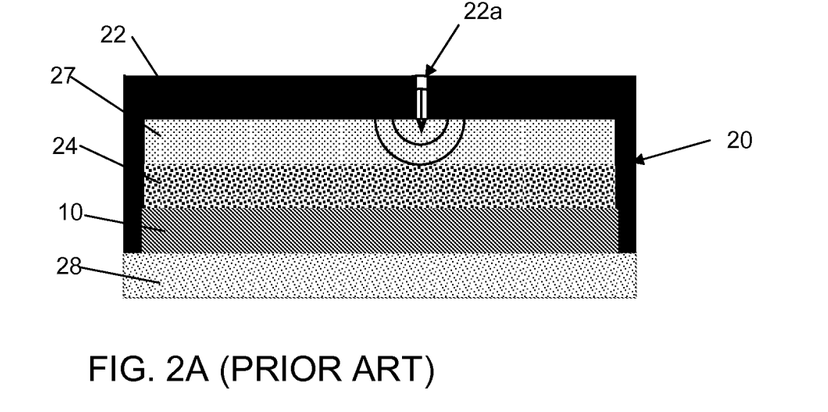
FIG. 2A shows a physical phenomenon in a conventional opto-electric device.

FIG. 2A shows an opto-electric device not according to the invention, wherein a lateral diffusion layer is absent. The device merely has an organic layer 27 free from lateral diffusing particles. Water vapor penetrating the pinhole 22a diffuses isotropically in the organic layer. In particular for an opto-electric device it is desirable that the stack of layers forming part of the barrier structure is thin, e.g. not more than 100 μm, in order to achieve a good transparency. Consequently the organic layer has a thickness substantially smaller than the distance between the pinholes. This implies that water vapor reaches the getter layer 24 in a non-uniform manner. In front of the pinhole the diffusion of water vapor towards the getter layer will be relatively high, while in areas between the pinholes the water vapor diffusion rate will be low. As a result, the getter layer may locally become saturated, and consequently may be no longer functional, therewith causing a local deterioration of the opto-electric device.

Figure 2B:
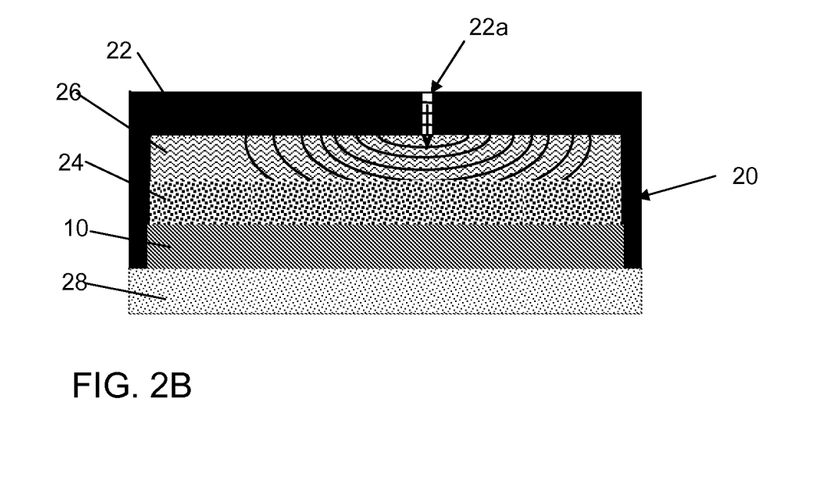
FIG. 2B shows the effect of the inventive measure in said first embodiment of an opto-electric device according to the first aspect of the invention.

Considering now an arrangement according to the present invention as shown in FIG. 2B, wherein a lateral diffusion layer 26 is present between the getter layer 24 and the inorganic layer 22. The presence of the lateral diffusion layer 26 causes the water vapor to diffuse substantially faster in lateral directions than in a direction perpendicular to the lateral diffusion layer 26. As a result the water vapor diffusion towards the getter layer 24 assumes a substantially more uniform spatial distribution in the plane of the getter layer 24. As a result a larger area of the getter layer 24 is available for absorbing or binding the water vapor and a local saturation of the getter layer 24 is avoided. As indicated above, the opto-electric device may have an organic planarization layer between the lateral diffusion layer 26 and the inorganic layer 22.

Figure 3:
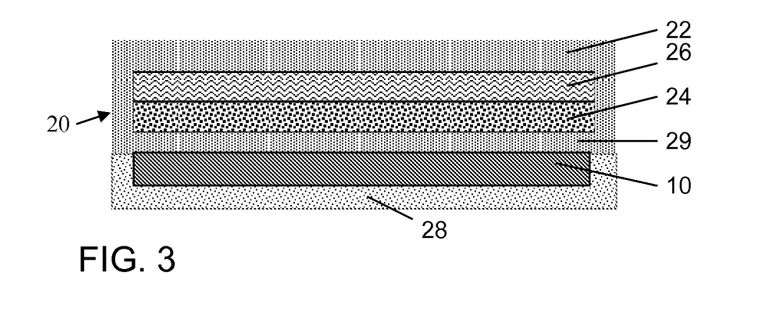
FIG. 3 shows a second embodiment of an opto-electric device according to the first aspect of the invention.

FIG. 3 shows another embodiment of an opto-electric device according to the present invention. Therein the stack of layers comprises at least one further inorganic layer 29 that is arranged between the organic opto-electric element 10 and the getter layer.

Figure 4:
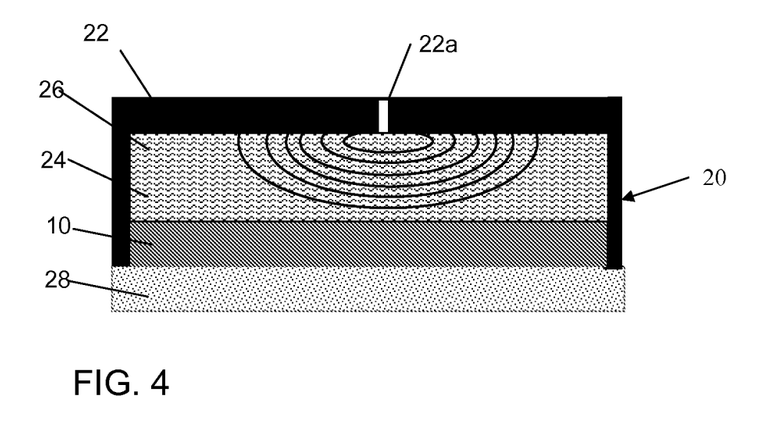
FIG. 4 shows the effect of the inventive measure in a third embodiment of an opto-electric device according to the first aspect of the invention.

FIG. 4 shows again another embodiment of an opto-electric device according to the present invention. Therein the lateral diffusion layer 26 comprises the getter material. It is illustrated by concentric ellipsoids around the pinhole 22a that moisture and/or other substances are spread laterally so that a saturation of the getter material over the entire depth of the layer in front of the pinhole 22a is avoided.

Figure 5:
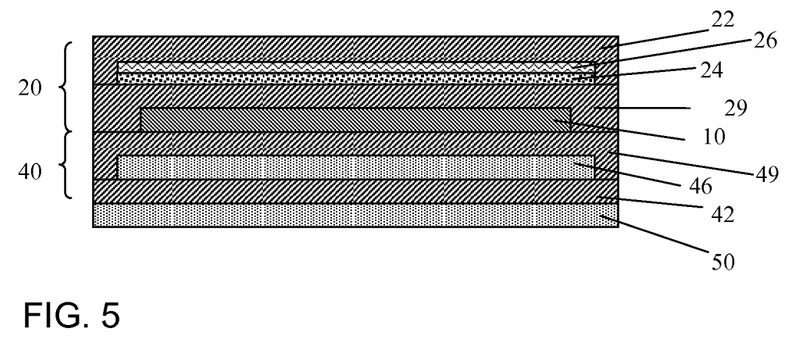
FIG. 5 shows a fourth embodiment of an opto-electric device according to the first aspect of the invention.

FIG. 5 shows a further embodiment of an opto-electric device according to the present invention. In the embodiment shown therein the opto-electric device has a barrier structure comprising a first and a second stack 20, 40 of layers between which the opto-electric element 10 is arranged. The first stack 20 comprises inorganic layer 22, lateral diffusion layer 26, getter layer 24 and inorganic layer 29. The second stack 40 comprises inorganic layer 42, organic layer 46 and inorganic layer 49. The first and the second stack and the opto-electric element 10 arranged in between are carried by a polymer foil 50. In this case only the first stack 22, 26, 24, 29 comprises a lateral diffusion layer 26 and a getter layer 24. The second stack 42, 46, 49 is a conventional barrier stack, having an organic layer 46 arranged as a decoupling and planarization layer between the inorganic layers 42 and 49. In this arrangement the opto-electric element has preferably its cathode layer facing the first stack 20, as the opto-electric element is most vulnerable at its cathode side and the first stack 20 has the highest vapor blocking capability. In a variation of this embodiment the organic layer 46 is replaced by a combination of a lateral diffusion layer and a getter layer, and the lateral diffusion layer is arranged between the getter layer and the inorganic layer 42.

In an embodiment the opto-electrical element is an OLED. The OLED has a light emitting layer arranged between a cathode and an anode. In case the device has a metal substrate, the latter may function as an electrode. For an improved functionality the OLED typically has additional functional layers, such as a hole injection layer, a hole transport layer, an electron injection layer etc.

FIG. 6A-6D show a first embodiment of a method according to the second aspect of the present invention.

Figure 6A:
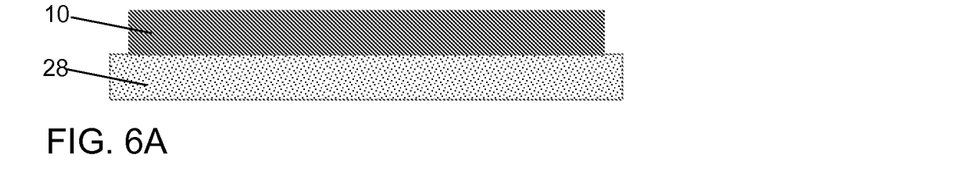
FIG. 6A to 6D show a first embodiment of a method according to the second aspect of the invention.

FIG. 6A shows a first step, wherein an opto-electric element 10 is provided. The opto-electric element 10 is provided at a surface 28 of substrate that has barrier properties. Alternatively the opto-electric element 10 may be placed at a temporary substrate that is replaced in a later stage of the manufacturing process by a final substrate having barrier properties.

Figure 6B:
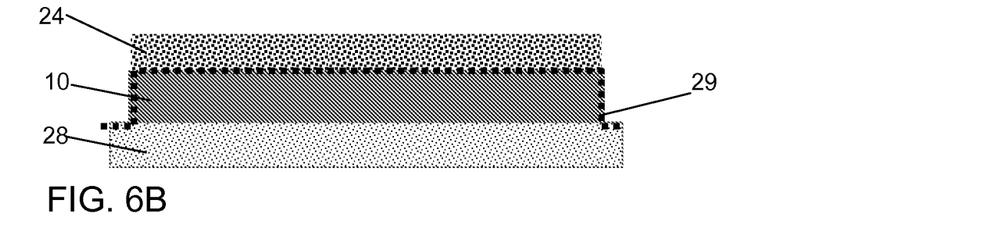

FIG. 6B shows a second step, wherein a getter layer 24 is applied on the opto-electric element. The getter-layer may be applied as a dispersion of getter particles in an organic precursor. After application, e.g. by spin-coating or printing the organic precursor is cured, e.g. by UV-radiation. Instead of applying the getter material as a dispersion of particles, a molecular getter may be applied instead. In an embodiment the second step is preceded by an additional step wherein a barrier layer 29 is provided.

Figure 6C:
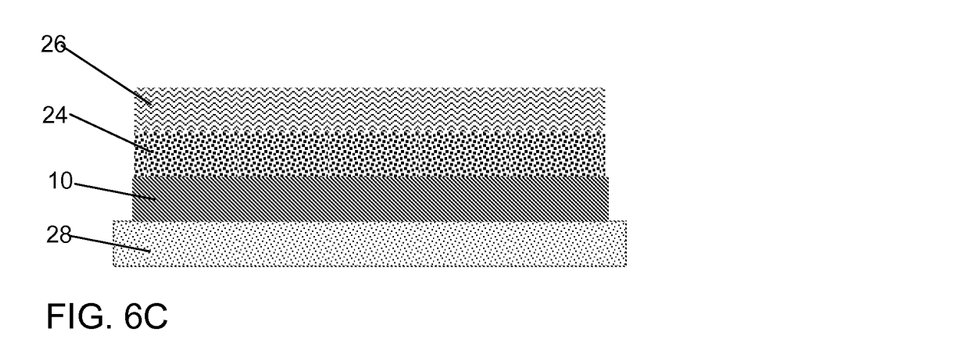

FIG. 6C shows a third step, wherein a lateral diffusion layer 26 is applied on the getter layer 24.

Figure 6D:
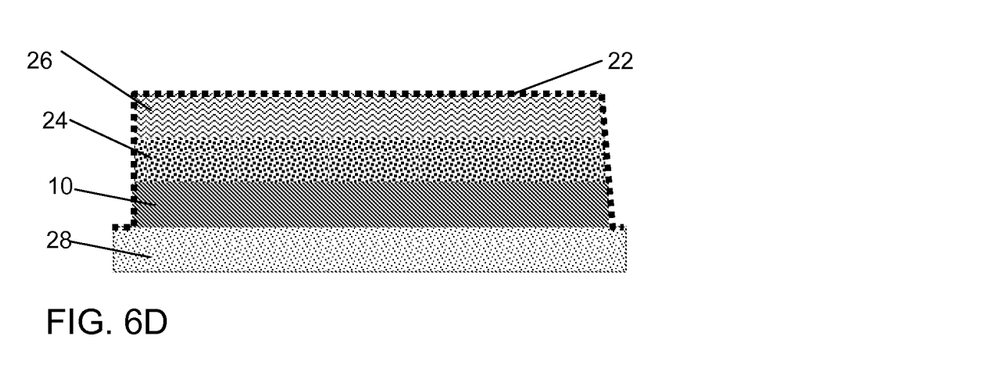

FIG. 6D shows a fourth step, wherein an inorganic layer 22 is applied. The inorganic layer 22 and the substrate 28 encapsulate the opto-electric element 10.

A possible implementation for the third step is now described in more detail with reference to FIG. 7A-7D.

Figure 7A:
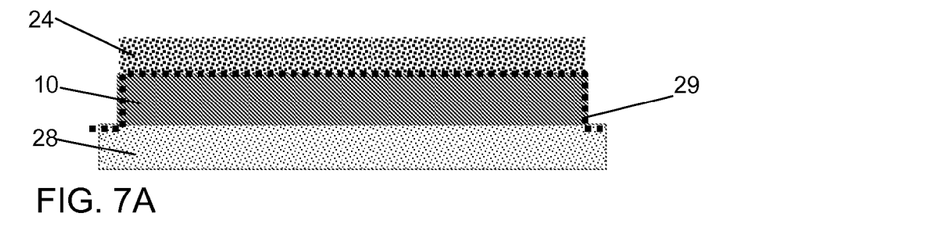
FIG. 7A to 7E show a second embodiment of a method according to the second aspect of the invention.

FIG. 7A shows the semi-finished product obtained after the second step as described with reference to FIG. 6B.

Figure 7B:
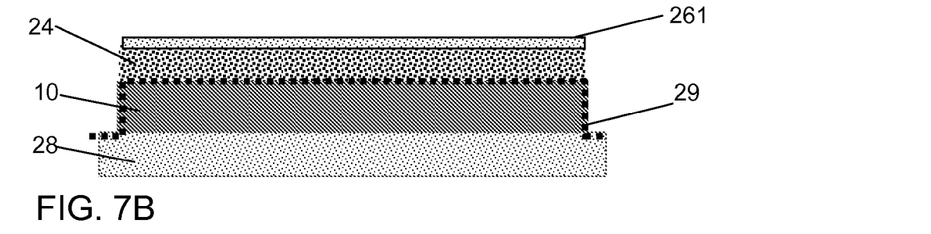

FIG. 7B shows a first substep wherein a planarization layer 261 is applied on the getter layer 24. This first substep may be omitted if the getter layer 24 is already sufficient planar. For example, when an active polymeric barrier layer is used as described above.

Figure 7C:
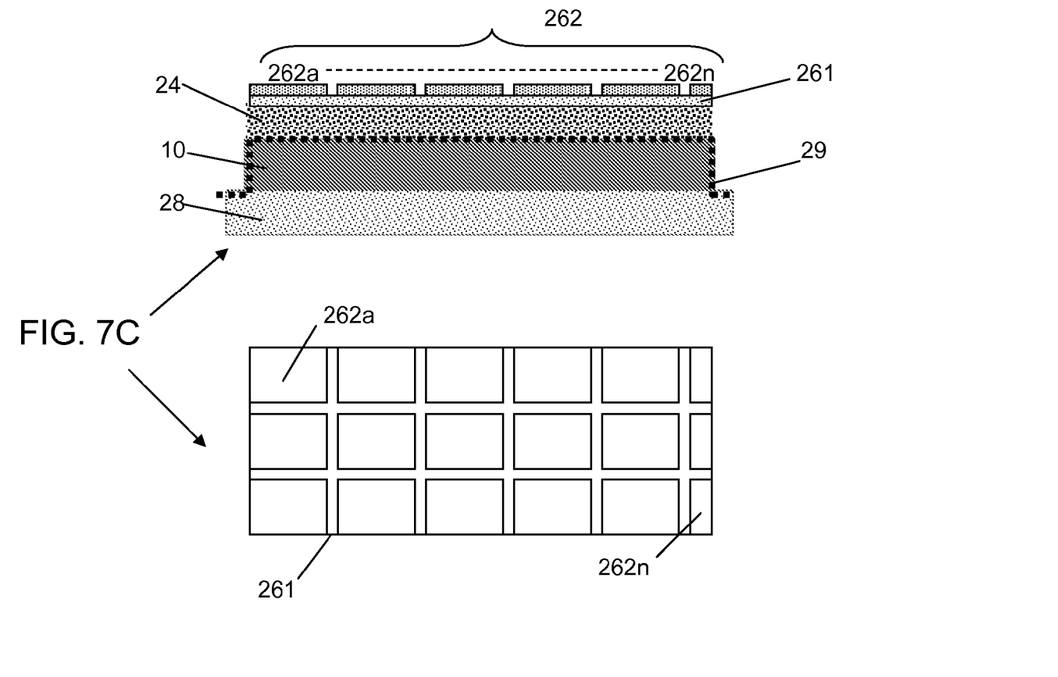

FIG. 7C shows a second substep wherein a patterned inorganic layer 262 is deposited on the planarization layer 261. The patterned inorganic layer 262 comprises segments 262a, . . . , 262n. The segments preferably have a lateral size in the order of 100 μm to 10 cm. The resulting transverse water vapor transmission rate is typically in the order of at least $10^{-3}$ g·m$^{-2}$·day$^{-1}$ so that the transverse diffusion is substantially slower than the transversal diffusion. The patterned inorganic layer 262 may be applied by standard lithographic methods, for example by a vapor deposition method using a shadow mask. Alternatively, a lift-off technique is used. FIG. 7C both shows the intermediary result as a cross-section (top of FIG.) and a top view (Bottom part)

Figure 7D:
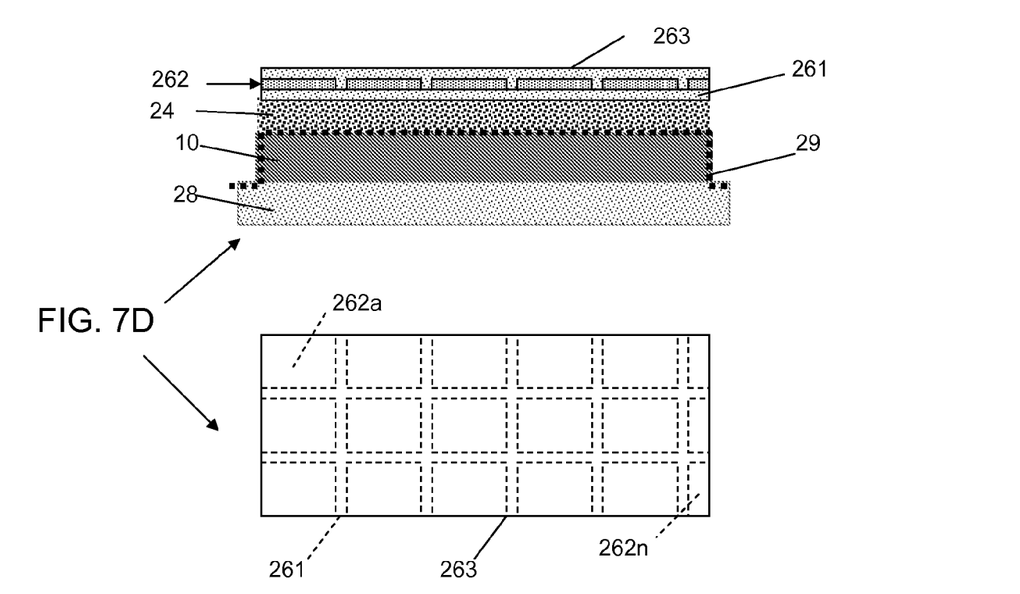

In third substep, shown in FIG. 7D a planarization layer 263 of an organic material is deposited on the patterned inorganic layer 262. In a fourth substep, shown in FIG. 7E, a further patterned inorganic layer 264 is deposited on the planarization layer 263 having a pattern that is offset in comparison to the pattern of the patterned inorganic layer 262.

Figure 7E:
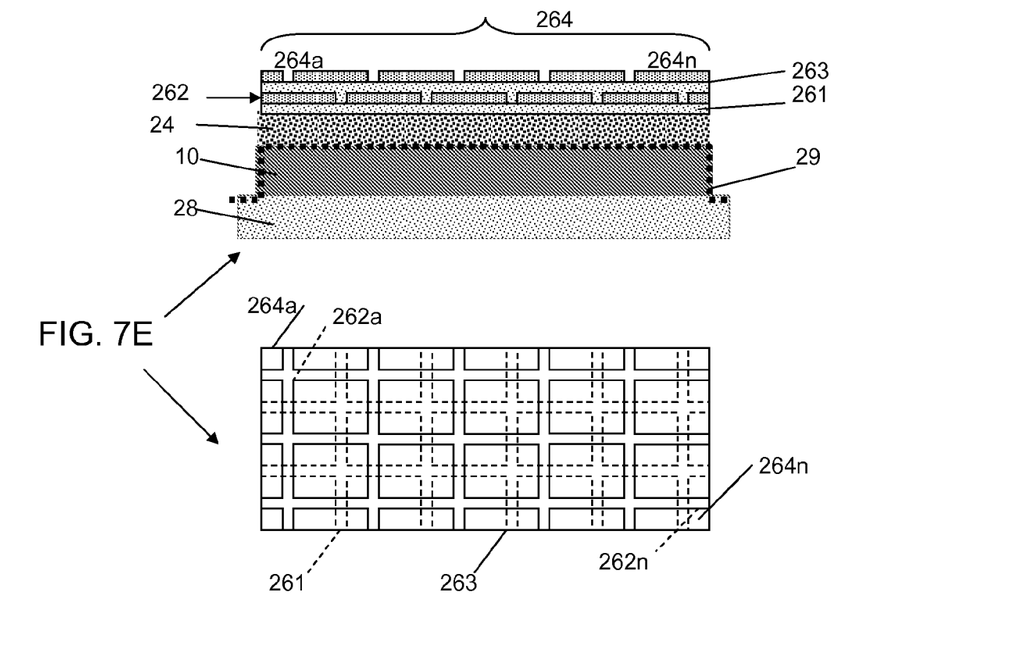

The second and the third substep may be repeated an arbitrary number of times. Therewith each patterned inorganic layer is applied with an offset relative to the previous patterned inorganic layer. In the last substep preceding the application of the inorganic layer 22 a planarization layer is deposited, to planarize the last patterned inorganic layer. As the patterned inorganic layer is applied by a lithographic processing method the segments thereof are typically well aligned with the plane of said inorganic layer, so that a relatively thin planarization layer, e.g. in the order a few times the thickness of the segments suffices. For example the segments may have a thickness of 50 to 200 nm and the planarization layer may have a thickness in the range of 2 to 5 times this thickness.

Nevertheless also a planarization having a larger thickness may be used. The methods described with reference to FIG. 7A to 7D are favorable in that the properties of the layer can be controlled very accurately. It is noted that the second step may be omitted if a getter material is integrated in one or more of the planarization sub-layers 261, 263.

According to a method very suitable for application in an industrial process a dispersion of inorganic anisotropic particles in a liquid organic precursor is deposited, and the organic precursor is cured after deposition.

Although the present invention is specifically explained with reference to an OLED, the invention is equally applicable to opto-electric devices having another opto-electric element, such as an electrochromic device, or a photovoltaic device.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

The invention claimed is:

1. An opto-electric device comprising an opto-electric element that is enclosed by a barrier structure for inhibiting a transmission of moisture from an environment towards the opto-electric element, the barrier structure including a stack of layers comprising at least an inorganic layer and a moisture getter material in a layer arranged between the inorganic layer and the opto-electric element, characterized in that the stack includes a lateral diffusion layer, being an organic layer having anisotropic particles that are aligned with the layer, wherein the getter material is present in a separate getter layer arranged between the opto-electric element and the lateral diffusion layer.

2. The opto-electric device according to claim 1, wherein the barrier structure includes a further stack of layers and wherein the opto-electric element is encapsulated by the stack of layers and the further stack of layers, the further stack of layers comprising at least two inorganic layers.

3. The opto-electric device according to claim 2, wherein the further stack of layers further comprises includes a further lateral diffusion layer between the further inorganic layers, and wherein further getter material is present in a further separate getter layer arranged between the opto-electric element and the further lateral diffusion layer and/or the further getter material is present in the further lateral diffusion layer.

4. The opto-electric device according to claim 1, wherein the barrier structure includes a metal foil, the opto-electric element being encapsulated by the stack of layers and the metal foil.

5. The opto-electric device according to claim 1, wherein one or more organic layers are obtained by curing with actinic radiation a photocurable resin composition comprising:

(A) at least one aromatic acrylate or methacrylate component, or any mixture thereof;
(B) at least one monofunctional acrylate, methacrylate, vinylamide, acrylamide or methacrylamide component, preferably with a viscosity below 100 mPa·s at 30° C., or any mixture thereof;
(C) at least one photo initiator, or any mixture thereof.

6. The opto-electric device according to claim 5, wherein the photocurable resin composition comprises:
(A) 30-90% by weight of the aromatic acrylate or methacrylate component A;
(B) 1-30% by weight of the monofunctional acrylate, methacrylate, vinylamide, acrylamide or methacrylamide component B;
(C) 0.1-10% by weight of the photo initiator C;
based on the total weight of the resin composition.

7. The opto-electric device according to claim 1, wherein one or more organic layers are obtained by curing with actinic radiation a photocurable resin composition comprising:
(D) at least one polybutadiene acrylate or methacrylate component, or any mixture thereof;
(E) at least one acrylate or methacrylate component not exhibiting polybutadiene groups, preferably with a viscosity below 100 mPa·s at 30° C., or any mixture thereof;
(C) at least one photo initiator, or any mixture thereof.

8. The opto-electric device according to claim 7, wherein the photocurable resin composition comprises:
(D) 10-60% by weight of the polybutadiene acrylate or methacrylate component D;
(E) 1-89.9% by weight of the acrylate or methacrylate component E;
(C) 0.1-10% by weight of the photo initiator C;
based on the total weight of the resin composition.

9. The opto-electric device according to claim 1, wherein one or more organic layers are obtained by curing with actinic radiation a photocurable resin composition comprising:
(F) at least one urethane acrylate or methacrylate component, or any mixture thereof;
(E) at least one acrylate or methacrylate component not exhibiting urethane groups, preferably with a viscosity below 100 mPa·s at 30° C., or any mixture thereof;
(C) at least one photo initiator, or any mixture thereof.

10. The opto-electric device according to claim 9, wherein the photocurable resin composition comprises:
(F) 5-50% by weight of the urethane acrylate or methacrylate component F;
(E) 1-94.9% by weight of the acrylate or methacrylate component E;
(C) 0.1-10% by weight of the photo initiator C;
based on the total weight of the resin composition.

11. The opto-electric device according to claim 1, wherein one or more organic layers are obtained by curing with actinic radiation a photocurable resin composition comprising:
(G) at least one acrylate or methacrylate component, or any mixture thereof with a clogP value >2;
(H) at least one thiol component, or any mixture thereof;
(C) at least one photo initiator, or any mixture thereof.

12. The opto-electric device according to claim 11, wherein the photocurable resin composition comprises:
(G) 20-98.9% by weight of the acrylate or methacrylate component G;
(H) 1-20% by weight of the thiol component H;
(C) 0.1-10% by weight of the photo initiator C;
based on the total weight of the resin composition.

13. The opto-electric device according to claim 1, wherein one or more organic layers are obtained by curing with actinic radiation a photocurable resin composition comprising:

(I) at least one epoxy polysiloxane component;
(J) at least one cationic photo initiator, or any mixture thereof.

14. The opto-electric device according to claim 13, wherein the photocurable resin composition comprises:
(I) 20-99.9% by weight of the epoxy polysiloxane component I;
(K) 0.2-79.9% by weight of an epoxy or oxetane functional organic component or mixture of epoxy or oxetane functional organic components not exhibiting polysiloxane groups.
(J) 0.1-10% by weight of the photo initiator J;
based on the total weight of the resin composition.

15. The opto-electric device according to claim 1, wherein one or more organic layers are obtained by curing with actinic radiation a photocurable resin composition with a clogP value >2.

16. A method for manufacturing an opto-electric device, the method comprising the following steps in the order presented or in the reverse order
providing an opto-electric element,
applying a getter layer,
applying a lateral diffusion layer, being an organic layer comprising anisotropic particles that are aligned therewith,
applying an inorganic layer, therewith obtaining a stack subsequently comprising the opto-electric element, the getter layer, the lateral diffusion layer and the inorganic layer.

17. The method for manufacturing an opto-electric device according to claim 16, wherein the lateral diffusion layer comprises a mixture of moisture getter particles and the anisotropic particles and the method further comprising the step of
applying an inorganic layer, therewith obtaining a stack subsequently comprising the opto-electric element, the getter layer, the lateral diffusion layer and the inorganic layer.

18. The method according to claim 16, comprising the steps of
providing the anisotropic particles as a dispersion in a liquid precursor of an organic material,
depositing the dispersion in a layer,
curing the deposited layer.

19. The method according to claim 16, wherein the step of applying the lateral diffusion layer comprises the substeps of stackwise applying
a patterned inorganic layer,
a planarization layer of an organic material,
repeating the substeps of applying the patterned inorganic layer and applying the planarization layer, therewith providing for an offset in the pattern of the patterned organic layer and the patterned organic layer applied in the preceding step.

20. The method according to claim 19, wherein at least one of the planarization layers comprises a getter material.

21. The opto-electric device according to claim 1, wherein getter material is present in the lateral diffusion layer.

* * * * *